United States Patent
Wolfe et al.

(10) Patent No.: US 7,960,708 B2
(45) Date of Patent: Jun. 14, 2011

(54) DEVICE AND METHOD FOR MANUFACTURING A PARTICULATE FILTER WITH REGULARLY SPACED MICROPORES

(75) Inventors: John C. Wolfe, Houston, TX (US); Paul Ruchhoeft, Missouri City, TX (US)

(73) Assignee: University of Houston, Houston, TX (US)

( * ) Notice: Subject to any disclaimer, the term of this patent is extended or adjusted under 35 U.S.C. 154(b) by 668 days.

(21) Appl. No.: 11/856,615

(22) Filed: Sep. 17, 2007

(65) Prior Publication Data

US 2009/0073400 A1    Mar. 19, 2009

Related U.S. Application Data

(60) Provisional application No. 60/894,593, filed on Mar. 13, 2007.

(51) Int. Cl.
*G21K 5/02* (2006.01)
*G21K 5/08* (2006.01)

(52) U.S. Cl. ............... 250/492.1; 250/491.1; 250/492.3; 430/4; 430/5; 430/269; 430/270.1; 216/56

(58) Field of Classification Search ............... 250/491.1, 250/492.1, 492.2, 492.21, 492.3; 430/4, 430/5, 269, 270.1, 297, 298, 299, 302, 310; 216/56
See application file for complete search history.

(56) References Cited

U.S. PATENT DOCUMENTS

| | | | |
|---|---|---|---|
| 3,303,085 A | 2/1967 | Price et al. | |
| 3,770,532 A | 11/1973 | Bean et al. | |
| 3,802,972 A | 4/1974 | Fleischer et al. | |
| 4,832,997 A | 5/1989 | Balanzat et al. | |
| 5,543,046 A | 8/1996 | Van Rijn | |
| 5,753,014 A | 5/1998 | Van Rijn | |
| 5,786,396 A * | 7/1998 | Takita et al. | 521/64 |
| 6,762,396 B2 * | 7/2004 | Abbott et al. | 219/543 |
| 2003/0020024 A1 * | 1/2003 | Ferain et al. | 250/492.1 |
| 2005/0128448 A1 * | 6/2005 | Box et al. | 355/53 |
| 2005/0263452 A1 * | 12/2005 | Jacobson | 210/484 |
| 2006/0124865 A1 | 6/2006 | Wolfe et al. | |
| 2006/0280906 A1 * | 12/2006 | Trentacosta et al. | 428/137 |
| 2007/0116610 A1 * | 5/2007 | Cuppoletti | 422/101 |

OTHER PUBLICATIONS

R.G. Musket, "Extending ion-track lithography to the low-energy ion regime," Journ. Appl. Phys. 99, 114314 (2006).
Emissivity of Materials, http://www.electro-optical.com/bb_rad/emissivity/matlemisivty.htm#Conductive Paints.
Nobuhiro Tokoro, et al., "Introduction of the Varian VIISta 3000 Single Wafer High-Energy Ion Implanter," IEEE Conf. on Ion Implantation Technology, 368 (2000).
A. Roy, et al., "Image noise in helium lithography," In press Journ. Vac. Sci. Technol.
J.R. Wasson, et al., "Ion Absorbing Stencil Mask Coatings for Ion Beam Lithography" Journ. Vac. Sci. Technol. B 15, 2214-2217 (1997).

(Continued)

*Primary Examiner* — David A Vanore
*Assistant Examiner* — Nicole Ippolito Rausch
(74) *Attorney, Agent, or Firm* — Winstead PC

(57) ABSTRACT

Various embodiments disclose devices and methods for fabricating microporous particulate filters with regularly space pores wherein sheet membrane substrates are exposed to energetic particle radiation through a mask and the damaged regions removed in a suitable developer. The required depth of field is achieved by using energetic particles to minimize diffraction and an energetic particle source with suitably small diameter.

30 Claims, 8 Drawing Sheets

OTHER PUBLICATIONS

T. Yamauci, et al., "Structural modification along heavy ion tracks in poly(allyl diglycol carbonate) films," Japanese Journ. Appl. Phys. 47, 3606 (2008).

J. N. Randall and J. C. Wolfe, "Preparation of X-ray lithography masks using a tungsten reactive ion etching process," Appl. Phys. Letts. 41, 247-248 (1982).

S.V. Pendharkar and J. C. Wolfe, "Tungsten trench etching in a magnetically enhanced triode reactor," Journal of Vaccum Science and Technology 12, 601-604 (1994).

L. R. Harriott, "SCALPEL: projection electron beam lithography," Proceedings of the Particle Accelerator Conference, 595, 1999.

Han, et al., "Fabrication and Characterization of Polymeric Microfiltration Membranes using Aperture Array Lithography," Journal of Membrane Science, vol. 249 Issues 1-2, pp. 193-206 (2005).

PCT Search Report pertaining to Application No. PCT/US08/56848 dated Jul. 28, 2008.

* cited by examiner

FIG. 10a    FIG. 10b

DEVICE AND METHOD FOR MANUFACTURING A PARTICULATE FILTER WITH REGULARLY SPACED MICROPORES

CROSS REFERENCE TO RELATED APPLICATIONS

This application claims priority to U.S. Provisional Application No. 60/894,593, filed on March 13, 2007. The entirety of US Provisional Application No. 60/894,593 is incorporated herein by reference.

GOVERNMENT SPONSORSHIP

This invention was made with government support under grant no. ECS-0404308 awarded by the National Science Foundation. The government has certain rights in the invention.

BACKGROUND OF THE INVENTION

1. Field of the Invention

The present invention relates to a method for manufacturing a particulate filter comprising a membrane with a high density array of regularly spaced micropores and a macroporous support.

2. Description of the Background Art

A lithographic apparatus or device is a machine that applies a desired pattern onto a substrate, usually onto a target portion of the substrate, such as a membrane substrate. A lithographic device can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The formation of membrane filters with small straight-through holes of extremely small diameter and methods of making such porous bodies and/or microporous membranes are well known. Microporous membranes can be produced with particles which produce chains of defects in the glass, crystal or polymer membrane corresponding to the path of the particles. These defects make the areas around them very sensitive to various chemical agents. An exposure of relatively short duration to these agents makes it possible to produce pores at various locations. A longer exposure makes it possible to expand the number of pores. Accordingly, in various prior art processes the duration of chemical attack or etching facilitates control of the diameter of the pores produced, i.e. the filtration characteristic of the filter.

Various methods including combinations of irradiation damage along substantially straight paths and chemical removal of the damaged material to provide pores or holes; bombarding a solid with heavy energetic particles to produce tracks of radiation damaged material which are removed by etching; forming ionization tracks in a membrane and removing by exposure to a suitable etchant solution; two-step etching processes that permits widening of the ion tracks to make a range of larger pore sizes; and/or the like. Typically the pores have been constructed to have a conical shape so as to assist back flushing.

Often, however, filters constructed as disclosed have suffered from a high or higher specific flow resistance per unit area compared to other filter technologies. As a result, larger areas and/or higher differential pressures are required to achieve a particular filtrate flow than for low resistance filters. One solution for this issue has been the use of a macroporous support for a microporous filter membrane to enable thinner filter membranes to withstand the same filtration pressure. It has been observed that flow resistance is reduced in proportion to the reduction in thickness. Likewise, Keping Han, Wendong Xu, Ariel Ruiz, Paul Ruchhoeft, and Shankar Chellam, "Fabrication and Characterization of Polymeric Microfiltration Membranes using Aperture Array Lithography," *Journal of Membrane Science*, Vol. 249 Issues 1-2, pages 193-206 (2005) discloses the use of a regular array of etched pores to form a filter membrane. This enables higher pore densities than are possible by the random array formed by ionization tracks because it eliminates the possibility of overlapping pores which compromise the selectivity of the filter. The flow resistance is reduced in inverse proportion to the increase in pore density. Primarily, the filters with a support have been formed on a flat solid substrate, thereby having at least the additional material cost of the flat substrates, multiple fabrication process steps, with the attendant inherent variation, and the fabrication of a large area of membranes by splicing or tiling together a multitude of small discrete membranes.

Accordingly, it would be beneficial to the art field of producing filter membranes to accomplish at least one of minimizing process variation through producing the filter membranes in a continuous process; producing filter membranes with increased and/or enhanced pore density; producing filter membranes without the necessity of a solid support; and/or the like.

SUMMARY OF THE INVENTION

Various embodiments of the present invention generally relate to lithographic exposure devices for fabricating a microporous filter membrane comprising means for exposing a membrane substrate to a beam comprising at least one energetic particle; means for conveying said membrane substrate; and, a mask positioned between said membrane substrate and at least one source of said at least one energetic particle, said beam comprising at least one particle transmitted through said mask.

Further embodiments comprise a lithographic exposure device for fabricating a microporous filter membrane comprising a radiation source directed at least partially on a membrane substrate, wherein radiation emitted from said radiation source comprises a beam of at least one energetic particle; a device for conveying said membrane substrate comprising at least one supply reel and at least one take-up reel; and, a mask positioned between said membrane substrate and at least one source of said at least one energetic particle, said beam comprising at least one particle transmitted through said mask.

Further embodiments comprise a filter membrane produced with the device according to a process and/with a device as herein disclosed.

Further embodiments comprise a process for fabricating a membrane filter comprising the steps of conveying a membrane substrate in a stepwise fashion adjacent a mask; damaging said membrane substrate with at least one beam comprising at least one energetic particle emitted from at least one radiation source directed at least partially through said mask; and, removing said damaged membrane substrate with an etchant.

Still further embodiments comprise a process for fabricating a microporous membrane filter, said process comprising the steps of applying an intermediate mask layer and a resist coating to a membrane substrate; conveying said membrane substrate in a stepwise fashion adjacent a mask; exposing said resist coating with at least one beam comprising at least one energetic particle emitted from at least one radiation source directed at least partially through said mask; developing said resist coating; etching said resists' pattern through said intermediate mask layer; and, etching said intermediate mask layer's pattern into said membrane substrate.

A greater understanding of the present invention may be had from reference to the following detailed description and the appended claims.

BRIEF DESCRIPTION OF FIGURES

In order that the manner in which the above recited and other advantages and objects of the invention are obtained, a more particular description of the invention briefly described above will be rendered by reference to specific embodiments thereof, which are illustrated in the appended drawings. Understanding that these drawings depict only typical embodiments of the invention and are therefore not to be considered limiting of its scope, the invention will be described with additional specificity and detail through the use of the accompanying drawings in which:

FIG. 10a is an illustration of He+ion trajectories in a Mylar membrane filter for an initial energy of 400 keV.

FIG. 10b is an illustration of He+ion trajectories in a Mylar membrane filter for an initial energy of 600 keV.

DETAILED DESCRIPTION OF INVENTION

Figure 1:
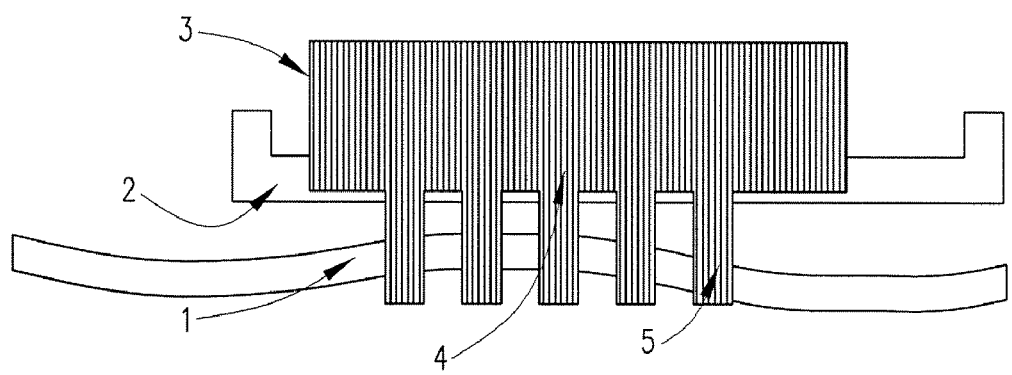
FIG. 1 is an illustration of an embodiment of the present invention wherein a beam of energetic particles impinges on a substantially planar mask perforated by openings damaging a non-planar membrane substrate in a highly uniform array of regularly spaced regions.

The particulars shown herein are by way of example and for purposes of illustrative discussion of the preferred embodiments of the present invention only and are presented in the cause of providing what is believed to be the most useful and readily understood description of the principles and conceptual aspects of various embodiments of the invention. In this regard, no attempt is made to show structural details of the invention in more detail than is necessary for the fundamental understanding of the invention, the description taken with the drawings and/or examples making apparent to those skilled in the art how the several forms of the invention may be embodied in practice.

The following definitions and explanations are meant and intended to be controlling in any future construction unless clearly and unambiguously modified in the following Examples or when application of the meaning renders any construction meaningless or essentially meaningless. In cases where the construction of the term would render it meaningless or essentially meaningless, the definition should be taken from Webster's Dictionary, $3^{rd}$ Edition.

As used herein, all percentages are percentages by weight, unless stated otherwise.

As used herein, the term "radiation" means and refers to energy radiated or transmitted as rays, waves, in the form of particles.

In general, various embodiments of the present invention provides processes and systems for manufacturing large area or enhanced area filter membranes from polymeric sheet stock. Further, various embodiments of the present invention relate to the as produced filter membranes. Embodiments of processes, systems and filters of the present invention generally provide for at least one of minimized process variation and cost through producing the filter membranes in a continuous process; producing filter membranes with increased and/or enhanced pore density without pore overlap; producing filter membranes without the necessity of a solid support; producing large area filters without the necessity of splicing or tiling small discrete filters together, and/or the like.

In various embodiments, energetic particles are used to damage a polymeric membrane substrate and a suitable etchant, such as, but not limited to a hot solution of KOH, is used to remove the damaged substrate material. A substantially uniform array of holes is formed by energetic particle exposure through a mask. In an embodiment, the array of holes is uniform throughout the substrate material.

Membrane substrates of the present invention can be produced supported or unsupported. In an embodiment, a membrane substrate is processed as a free-standing polymeric sheet. In an alternate embodiment, a macroporous backing is present on at least a portion of the substrate to enhance strength characteristics.

In various embodiments, a membrane substrate is deposited by extrusion, casting, spin coating, vapor deposition, epitaxy, chemical vapor deposition, sputtering, and/or any other process common in the art. Typical thicknesses of a membrane substrate of the present invention in an embodiment are about 20 μm to about 500 nm. In an alternate embodiment, a thicknesses of a membrane substrate of the present invention is about 100 nm to about 5 μm. In an alternate embodiment, a thicknesses of a membrane substrate of the present invention is about 10 nm to about 10 μm. In an alternate embodiment, a thicknesses of a membrane substrate of the present invention is about 5 nm to about 15 μm. However, in general, various embodiments of the membranes of the present invention can be formed of any thickness.

Deposition techniques are well understood in the art field, especially the semiconductor art field, and the production of substantially flat membrane substrate, void from any substantial protrusions or other irregularities, is readily obtainable. However, in applications where a substantially flat membrane substrate is not required, extrusion, casting, spraying, sol-gel plating, and/or the like is capable of use for forming the membrane substrate. In general, any technique known in the art can be used in various embodiments of the present invention.

A membrane filter of various embodiments of the present invention is characterized in that said membrane comprises a substantially flat layer of substantially uniform thickness and in that the surface of said layer is substantially void of any protrusions or any other irregularities. Appropriate thickness and uniformity of a membrane are characteristics capable of optimization to resist high relative fluxes from a variety of processes. To enhance the flow rate the filter should present a resistance which is as low as possible and therefore, in a preferred embodiment of the invention, comprises a membrane whose thickness is smaller than the average pore size and whose pore density is larger than 1 million per square centimeter.

In general, the characteristic of selectivity of a filter membrane is determined by its largest pore(s). Consequently it is desirable to have a pore size distribution which is as uniform as possible. In order to offer a large selectivity a specific embodiment of the filter according to the invention is characterized in that the pores consist of perforations with relatively smooth edges and in that the membrane features a relatively sharp, well defined pore size distribution within a standard deviation of less than about 5%, as mentioned previously. In an alternate embodiment the standard deviation is less than about 3%. In an alternate embodiment the standard deviation is less than about 1%.

Other embodiments are compared such that size of a hole differs by no greater than 5% from the size of any other hole formed in the substrate. In an alternate embodiment, the size difference is less than about 3%. In an alternate embodiment, the size difference is less than about 1%. In an alternate embodiment, the size difference is less than about 0.5%. In general, a membrane is capable of better performance characteristics with uniformity of hole size. However, various embodiments are capable of producing a non-uniform hole size as needed for a particular process and/or membrane.

Depending on the application for the membrane filter, the perforations in the membrane may be constructed so as to be cylindrical, tapering, and/or the like. Tapering embodiments are particularly useful in 'back flush' applications, clogged perforations are easily reopened by means of a counter pressure pulse.

Suitable materials for the membrane filter of various embodiments of the present invention are preferentially of a polymeric material, such as, but not limited to polyurethane, polytetrafluoroethylene (TEFLON), polyamide, polyamide, polyvinyl, polymethylmethacrylate, polypropylene, polyolefin, polycarbonate, polyester, cellulose, polyformaldehyde and polysulfone. Further embodiments are capable of comprising a biocompatible coating, such as a heparin coating and/or the like.

The support may be macroporous with a tortuous pore structure, a sintered ceramic material, a sintered metal powder or a polymeric tortuous membrane, as well as an initially dense material in which in a later stage openings are made, for example in a semiconductor wafer, a metal support or an inorganic disc. The total strength of a membrane substrate of the present invention may be increased by a number of relatively thin supporting bridges in the support underneath. In various embodiments utilizing a support, between the membrane layer and the support layer, an intermediate layer may be deposited for bonding enhancement and stress reduction. Bonding enhancement layers might be silicon dioxide and titanium dioxide depending upon the nature of the membrane and support materials. In various embodiments, the intermediate layer may moreover act as an etch stop layer.

Generally, in forming holes within the membrane substrate, any source of energetic particles, such as, ions, photons, electrons, neutral energetic atoms, and/or molecules can be used, such as, but not limited to photons, $He^+$, $H^+$, suitable equivalents, and/or the like. A substantially parallel beam of energetic particles is directed so as to impinge on a substantially planar mask perforated by stencil openings. In an embodiment, the stencil contains a series of uniform evenly dispersed holes through the mask. In an alternate embodiment, the stencil openings have a particular shape or design. Portions of the energetic particles passing through the holes or stencil openings in the mask damage a membrane substrate positioned about the mask. In various embodiments, the membrane substrate is essentially planar. In an alternate embodiment, the membrane substrate is non-planar.

After exposing the membrane substrate to the beam of energetic particles, the substrate may be washed in a suitable solvent to remove the damaged portions of the membrane substrate and thereby revealing the holes. Deformation of the membrane substrate during these steps is acceptable, under constraints of the present invention.

In an alternate embodiment of the method of the invention a deposited masking layer, particularly of a material sensitive to energetic particle exposure, is employed as the auxiliary layer which is brought in the desired pattern by means of an energetic particle lithography technique. The masking layer will be in contact with the membrane layer and therefore enables the transfer of its pattern to the membrane layer with a very high degree of precision. In yet an alternate embodiment an intermediate masking layer may be employed.

In various embodiments, a membrane filter of the present invention is bio-compatible. In an embodiment, a characteristic of a biocompatible membrane is that its surface is smooth, with a surface roughness less than the pore size will, thereby inhibiting sticking of particles or cells on the membrane and in the perforations. Accordingly, various embodiments of a biocompatible membrane of the present invention comprises a filter capable of use for cell-cell separation techniques and other medical and biomedical purposes.

In an embodiment of the filter according to the invention, the support and the membrane are constituted from equivalent materials with the same or similar components, for example polycarbonate. A filter of this kind is applicable in a wide temperature range, with a good cohesion between the support and the membrane.

Alternatively a membrane of the kind used in the filter according to various embodiments of the invention may itself very well act as a support for an ultrafiltration layer. Very thin ultrafiltration layers, typically with a thickness less than 200 nm, may be deposited in or over the perforations of the membrane to constitute an ultrafiltration filter. However, the thickness of the ultrafiltration layer can varied as is suitable for the particular process.

Figure 5:
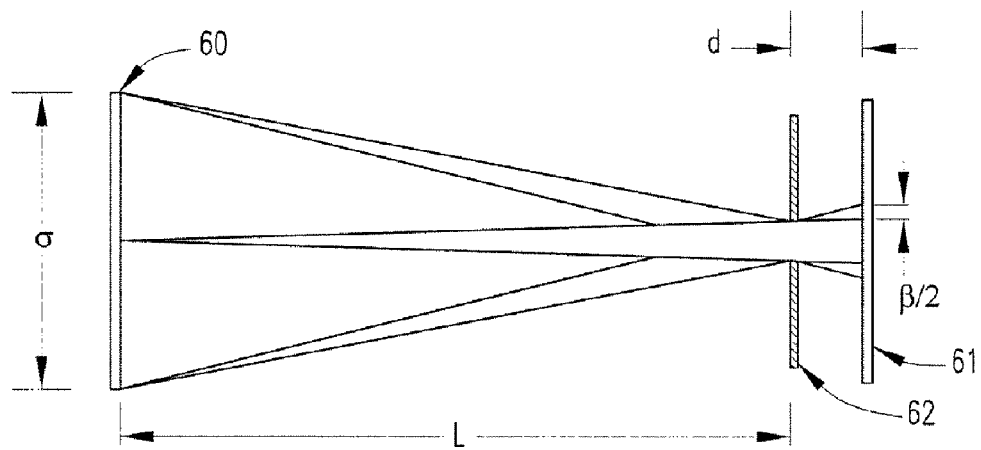
FIG. 5 is an illustration a shadow generated with particles emanating from different points on a source.

In various embodiments, a film processed under an embodiment of the present invention is held essentially stationary while energetic particle exposure is performed. In an embodiment, an electrostatic clamp as shown in FIG. 5 is used to clamp a thin metal film deposited onto the membrane substrate, thereby holding the membrane substrate essentially stationary with respect to the clamp.

In addition, for embodiments utilizing deposition on the membrane substrate, depending on the desired application, exemplary embodiments of the present process may utilize simultaneous or sequential deposition of multiple metals of controlled composition. Other exemplary embodiments may utilize small metal catalyst particles, such as nickel, to grow orderly arrays of precisely positioned carbon nanotubes, for example. The process may also allow for alternating between different gasses, ions, and/or precursors to form multilayer structures.

As such, various embodiments of the present invention comprise a lithographic exposure device for fabricating a microporous filter membrane comprising means for exposing a membrane substrate to a beam comprising at least one energetic particle; means for conveying said membrane substrate; and, a mask positioned between said membrane substrate and at least one source of said at least one energetic particle, said beam comprising at least one ion transmitted through said mask. Further embodiments comprise a filter membrane comprising at least one pore with at least one about one micrometer pore. In various embodiments, the mask is substantially stationary. In various embodiments, a clamp is used to secure said membrane substrate.

Any source of radiation can be used in various embodiments of the present invention. In an embodiment, a helium ion source is used for irradiation. In an embodiment, a hydrogen ion source is used for irradiation. However, in general, any radiation source can be used.

A suitable energy level is an energy level sufficient to completely penetrate the membrane substrate. The energy may be adjusted to tailor the specific shape of the micropores in the membrane. In various embodiments, the energy is greater than 500 keV. In various alternate embodiments, the energy is greater than 300 keV. In various alternate embodiments, the energy is greater than 100 keV. In various alternate embodiments, the energy is greater than 50 keV. In various alternate embodiments, the energy is greater than 25 keV. In various alternate embodiments, the energy is greater than 10 keV. In general, any energy level can be used as is appropriate for the particular application.

In various embodiments, a lithographic exposure device of an embodiment of the present invention comprises a system for conveying the membrane substrate in a stepwise fashion wherein said membrane substrate is advanced about a length of said mask for every step.

After exposure, an etchant system, such as hot KOH solution or an organic solvent, is used to remove the damaged membrane substrate.

Further embodiments comprise a process for fabricating a membrane filter, said process comprising the steps of conveying a membrane substrate in a stepwise fashion adjacent a mask; damaging said membrane substrate with at least one beam comprising at least one ion emitted from at least one radiation source focused at least partially through said mask; and, removing said damaged membrane substrate with an etchant.

Further embodiments comprise application of a high emissivity coating to said filter membrane substrate prior to exposure. As such, various further embodiments comprise removal of the high emissivity coating from said filter membrane substrate after exposure. An example of a water soluble high emissivity coating is black tempera paint. Most other paints, particularly those incorporating titanium dioxide particles also have high emissivity and can be removed in suitable solvents. Silicones also have high emissivities. The choice of a removable high emissivity coatings depends upon the ability of the membrane to withstand the solvent used to remove the coating. For example, Teflon membranes can tolerate acetone and commercial paint stripping solvents whereas polyester membranes cannot.

Further embodiments comprise a filter membrane produced according to the various methods and apparatuses herein disclosed.

In various embodiments, more than one etching step is performed, such that the film is etched by more than one etchant. A surfactant is capable of being added to the pre-etchant or etchant to improve their wetting characteristics and to lower the cone angle, as is understood by one of ordinary skill in the art.

Filters produced with various processes of the present invention are suitable for use in any process or apparatus wherein a separation at least partially based upon size is desired. As such, various embodiments find wide applicability for use in separating materials of a very small size, such as, for example and not by way of limitation, virus, cysts, bacteria and the like. Further industrial embodiments of various membranes produced with processes of the present invention comprise purification of drinking and waste water, pharmaceuticals, food, fuels, chemicals, gas separation ultra filtration filter(s), and/or the like.

Various embodiments of the present invention comprise a process for fabricating a membrane filter, said process comprising the steps of conveying a membrane substrate in a stepwise fashion adjacent a mask; damaging said membrane substrate with at least one beam comprising at least one energetic particle emitted from at least one radiation source directed at least partially through said mask; and, removing said damaged membrane substrate with an etchant.

Still further embodiments comprise a process for fabricating a microporous membrane filter, said process comprising the steps of applying an intermediate mask layer and a resist coating to a membrane substrate; conveying said membrane substrate in a stepwise fashion adjacent a mask; exposing said resist coating with at least one beam comprising at least one energetic particle emitted from at least one radiation source directed at least partially through said mask; developing said resist coating; etching said resists' pattern through said intermediate mask layer; and, etching said intermediate mask layer's pattern into said membrane substrate.

The invention may be embodied in other specific forms without departing from its spirit or essential characteristics. The described embodiments are to be considered in all respects only as illustrative and not restrictive. For example, ceramic materials are expected to function as membrane substrates. However, as the invention contemplates a reel to reel fabrication process, these embodiments were not mentioned, but would be acceptable. The scope of the invention is, therefore, indicated by the appended claims rather than by the foregoing description. All changes to the claims which come within the meaning and range of equivalency of the claims are to be embraced within their scope. Further, all published documents, patents, and applications mentioned herein are hereby incorporated by reference, as if presented in their entirety.

EXAMPLES

FIG. 1 is an illustration of beam (3) of energetic particles impinges on a substantially planar mask (2) perforated by stencil openings (4). A structured beam of transmitted beamlets (5) damages the non-planar membrane substrate (1) in a highly uniform array of regularly spaced regions.

Figure 2:
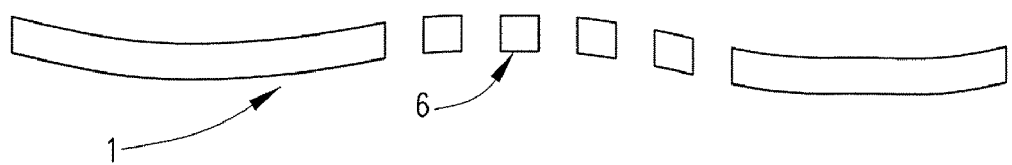
FIG. 2 is an illustration of a membrane substrate subjected to a beam of energetic particles according to the embodiment of FIG. 1 after development in a suitable solvent.

FIG. 1 illustrates the exposure process in which a substantially parallel beam (3) of energetic particles (ions, electrons, or neutral energetic atoms or molecules) impinges on a substantially planar mask (2) perforated by stencil openings (4). Transmitted beamlets (5) form a structured beam that damages the non-planar membrane substrate (1) in a highly uniform array of regularly spaced regions. FIG. 2 shows that after development in a suitable solvent, the non-planar membrane substrate (1) becomes permeated by a highly uniform array of regularly spaced pores (6). The substrate may deform from its original shape during development.

FIG. 2 is an illustration of a membrane substrate after development in a suitable solvent, the non-planar membrane substrate (1) is permeated by a highly uniform array of regularly spaced pores (6).

Figure 3:
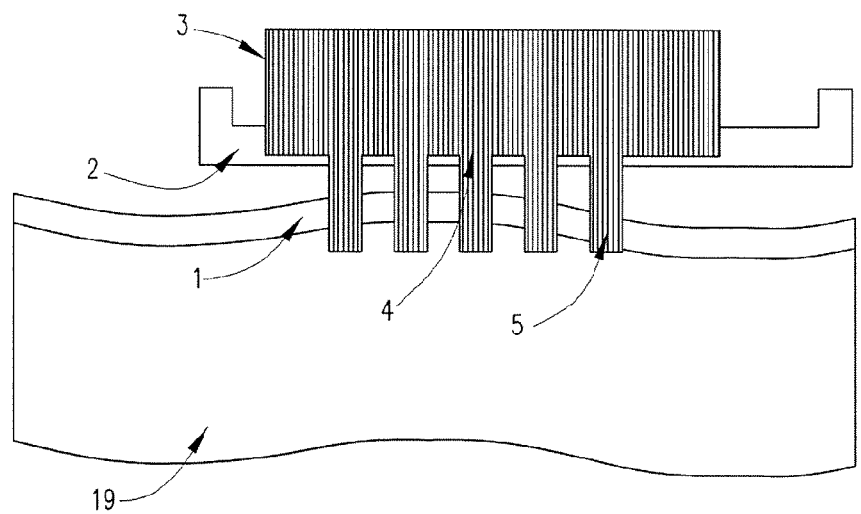
FIG. 3 is an illustration of an embodiment of the present invention where a high emissivity coating 19 is applied to the membrane to enhance radiative cooling during energetic particle exposure. The emissivity of the coating is dependent upon its thickness. In a preferred embodiment, the thickness is between 10 and 125 μm.

Generally, exposure of a membrane to energetic particles heats the membrane in proportion to the energy and flux density of the beam. Using a commercially available $H^+$ ion source operating at 500 keV, for example, it is possible, in a preferred embodiment, to achieve power densities of 0.15 $W/cm^2$ on a 3 µm thick polymeric membrane. Since energetic particle beams operate in a high vacuum of 10-5 Torr or less, the only way to remove this heat is through radiation. For an emissivity of unity, the peak temperature rise of the membrane would be less than 40° C., a temperature that all polymers could endure. However, for an emissivity of 0.1, the temperature would rise to 300° C., which would severely damage the more temperature sensitive polymers such as polyester. It may be advantageous, therefore, to apply a high thermal emissivity coating to one side of the membrane substrate prior to exposure to the energetic particle beam. The coating should be applied to the side that is opposite to the side irradiated by energetic particles. In an embodiment, the emissivity of such a coating is about greater than 0.9. In an alternate embodiment, the emissivity of such a coating is about greater than 0.8. In an alternate embodiment, the emissivity of such a coating is about greater than 0.5. However, one of ordinary skill in the art would be able to select an emissivity appropriate for the particular application. The high emissivity coating should be easily removed after the exposure, preferably during the removal of the damaged regions of the membrane substrate. There are many examples of high emissivity coatings including paints containing particles $TiO_2$. Water soluble paints, such as black tempura, can be removed during development. Spray coating provides a practical and inexpensive way of coating just one side of the membrane substrate. FIG. 3 is an illustration of the an embodiment of the present invention where a high emissivity coating (7) is applied to the membrane to enhance radiative cooling during energetic particle exposure. The emissivity of the coating is dependent upon its thickness. In a preferred embodiment, the thickness is between 10 and 125 µm.

For patterning a non-planar substrate, the dimensions of the transmitted beamlets should be essentially unchanged over the height of the topography. In the processing of polymeric sheet stock as described below, flatness is not expected to be better than 1 mm. Moreover, under high tension, most substrates form tension wrinkles, which are corrugations in the machine direction that disappear immediately after relieving tension. Substrates with buckles will usually form much larger tension wrinkles than flat substrates. As the film passes under the mask, the peaks of the tension wrinkles could scrape the mask causing it to break. Various embodiments therefore anticipate patterning over a distance of 5-10 mm from the mask. As such, various embodiments are capable of forming an image over such a large depth-of-field (DoF), defined as the maximum distance over which a particular feature size can be formed, is an important consideration.

Figure 4:
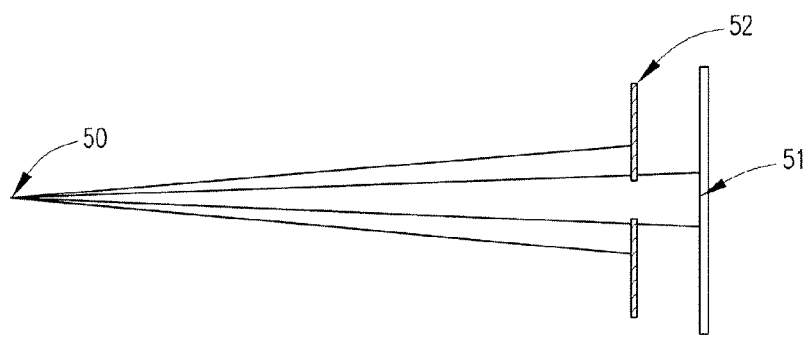
FIG. 4 is an illustration of a shadow generated with a point source of particles.

In various embodiments of a projection system, a system comprising energetic particle proximity lithography where DoF is limited primarily by the finite size of the energetic particle source is capable of being used. FIG. 4 shows that the edges of an image of a mask 52 on a substrate 51 are sharp and well-defined for a point-source 57 of particles. FIG. 5 shows that, for an extended source 60, the edges of the shadow of a mask 62 on a substrate 61 are blurred by the overlapping images created by ions emanating from different points on the source. The width β of this penumbral blur is approximately equal to the resolution limit in the printed image. Clearly, $β=dσ/L$ where σ is the diameter of the source, d is the distance from the mask to the substrate, and L is the distance from the source to the mask. In the duoplasmatron ion source, for example, DoF can be more than 10,000 times larger than the minimum resolvable feature; thus, 1 micrometer size features can be printed on a surface located 10 mm from the mask. This implies that a freestanding membrane need only be held flat within a 5-10 mm tolerance for creating 1 micrometer pore openings. This is more than 100,000 times less constraining than the 100 nm flatness tolerances discussed by Van Rijn.

Figure 6:
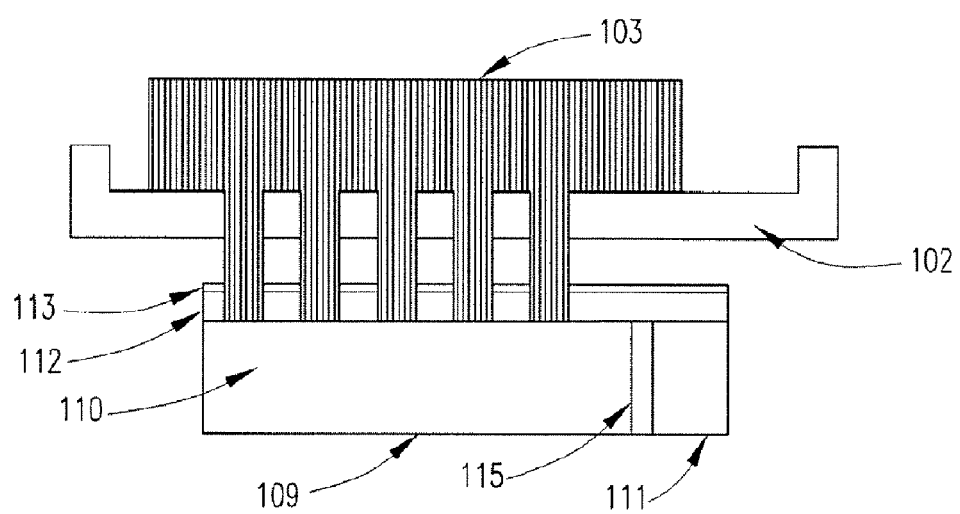
FIG. 6 is an illustration of an embodiment of electrostatic clamping for inhibiting substrate motion during ion exposure.

FIG. 6 is an illustration of an electrostatic clamping concept for preventing substrate motion during ion exposure. A conducting substrate platen 109 is divided by an electrically insulating spacer 112 into two conducting regions 110 and 111. The polymeric membrane material is coated with a thin metal film 113 to make the top surface electrically conducting. Electrostatic forces, generated by voltages applied to conducting regions 110 and 111 then clamp the polymer to the platen.

In various embodiments, the membrane substrate and the substrate platen 109 is divided by an electrically insulating spacer 112 into two regions 110 and 111. The polymeric membrane material may be coated with a thin metal film 114 to make the top surface electrically conducting and different voltages applied to regions 110 and 111. Electrostatic forces between the platen and the metal film then clamp the polymer to the platen. The flatness of the platen need only conform to the Depth of Field (DoF) specifications. Moreover, the clamping need not produce a perfectly flat polymeric film. Voids and wrinkles may be tolerated as long as they conformed to the DoF specifications.

Figure 7:
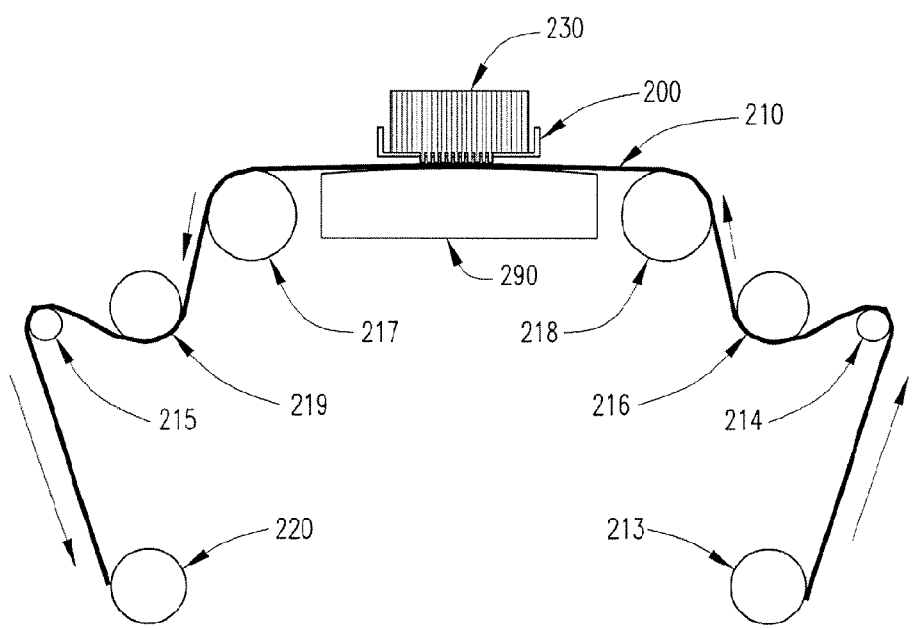
FIG. 7 is an illustration of an embodiment of a reel-to-reel apparatus for manufacturing microporous filters.

Now referring to FIG. 7, a reel-to-reel manufacturing apparatus is disclosed for manufacturing microporous filters in a continuous manner. Polymeric feed stock 210 is fed from a supply reel 213 through a series of in-feed rollers tensioner 214, capstan drive 216, and idler 218 onto the substrate platen 290 where it is exposed to an ion beam 230 through a stencil mask 200. After exposure, the membrane passes through tensioner 217, capstan drive 219, and idler 215 and wound on take-up reel 220.

In various embodiments, a film processed under an embodiment of the present invention is held stationary while energetic particle exposure is taking place. This could be done with an electrostatic clamp as shown in FIG. 5 where a substrate platen 109 is divided by an electrically insulating spacer 112 into two regions 110 and 111. The polymeric membrane material may be coated with a thin metal film 114 to make the top surface electrically conducting and different voltages applied to regions 110 and 111. Electrostatic forces between the platen and the metal film then clamp the polymer to the platen. The flatness of the platen need only conform to the DoF specifications. Moreover, the clamping need not produce a perfectly flat polymeric film. Voids and wrinkles may be tolerated as long as they conformed to the DoF specifications.

Figure 8:
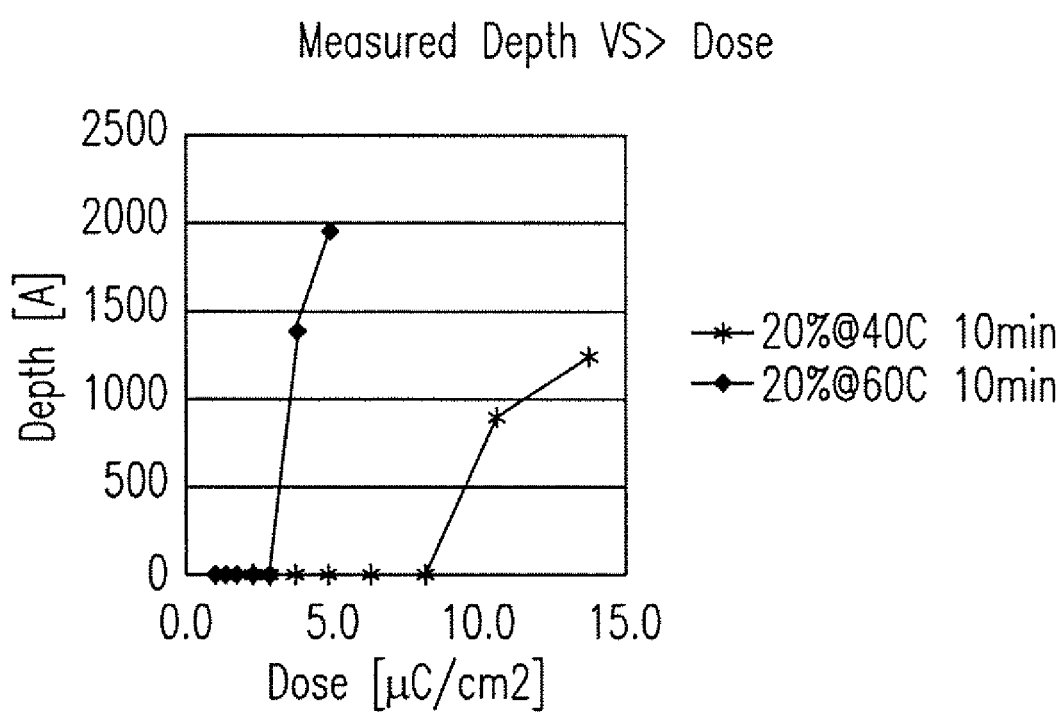
FIG. 8 is an illustration of an etch depth in a Mylar membrane filter, developed in a hot 20% $KOH/H_2O$ solution, as a function of 50 keV He+ ion dose.
Figure 9:
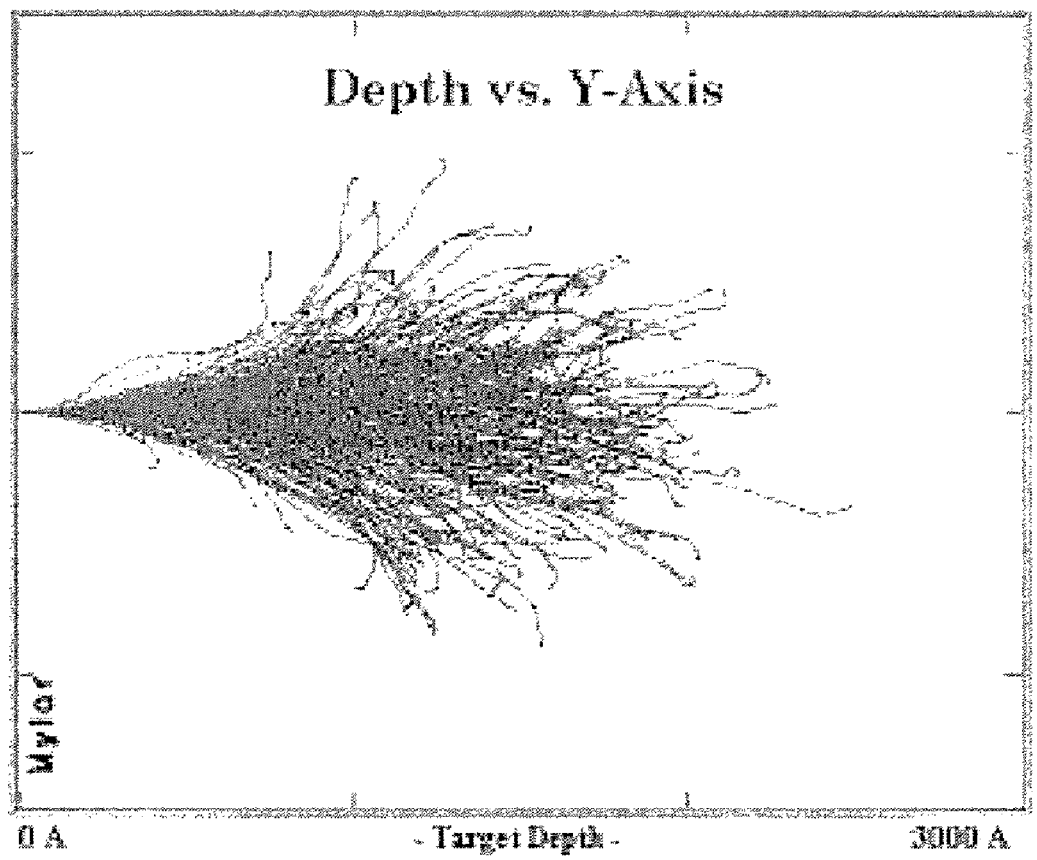
FIG. 9 is an illustration of $He^+$ ion trajectories in a Mylar membrane filter for an initial energy of 50 keV.
Figure 10C:
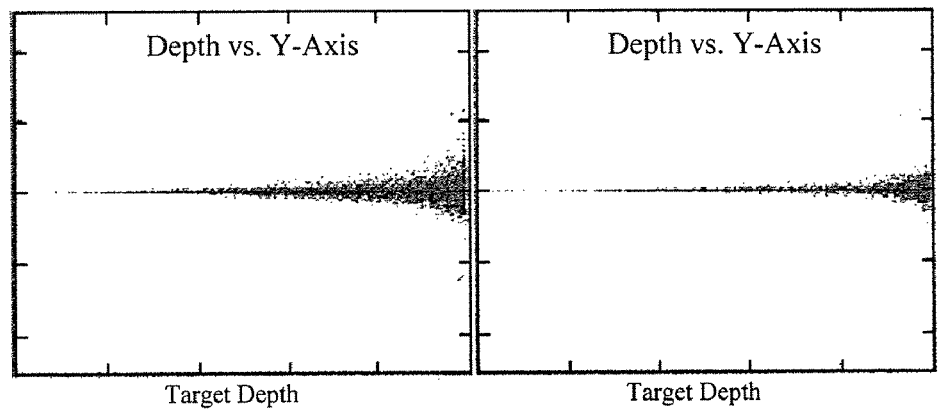
FIG. 10c is an illustration of He+ion trajectories in a Mylar membrane filter for an initial energy of 900 keV.
Figure 10C:
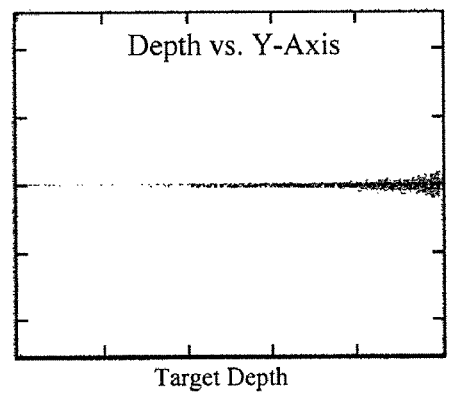

In an embodiment, experiments have demonstrated the patterning of a polyethylene teraphthalate (Mylar) film by 50 keV $He^+$ ion beam irradiation using a 20% $KOH/H_2O$ developer. FIG. 8 shows the development depth as a function of ion dose for 40° C. and 60° C. development temperatures. The dose required to remove 1500 angstroms is about 6 $\mu C/cm^2$. The etch depth typically is smaller than that required for fabricating membrane filters. This is because these low energy ions stop about 200 nm into the film, FIG. 9. The spreading of the ions near the end of their trajectories is also a concern because it is capable of degrading the resolution of the printed mask image. Hydrogen ions (protons) are capable of use in this regard. FIG. 10 shows that 400 keV, 600 keV, and 900 keV protons have sufficient range to penetrate mylar films of varying thickness, such as, but not limited to, 3, 4, and/or 5 micrometers with a blur of less than 0.1 micrometers.

Figure 11A:
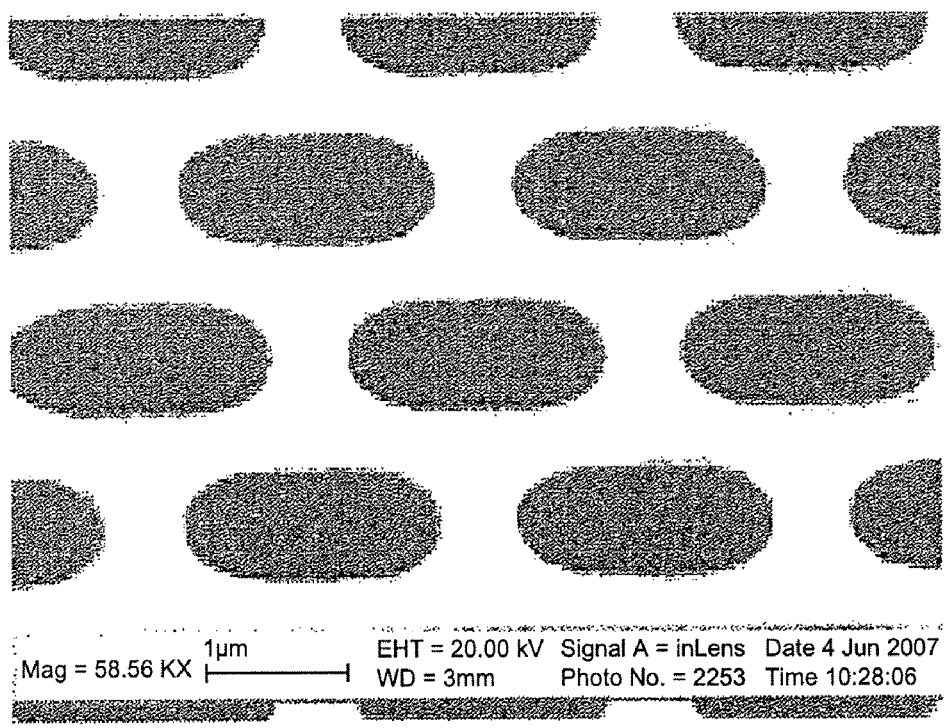
FIG. 11a is a scanning electron micrograph of a stencil mask for fabricating a particulate filter with 0.8 micron stencil openings.
Figure 11B:
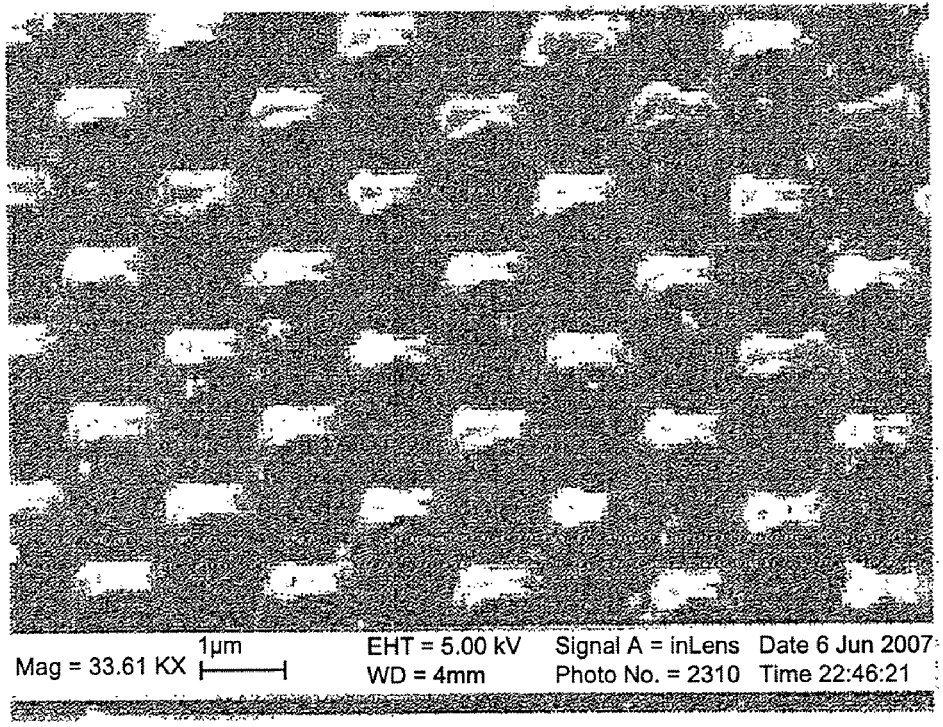
FIG. 11b is a scanning electron micrograph of a textured Mylar film printed with 50 keV helium ions and developed in a hot 20% KOH/H2O solution. The film was loosely attached to a platen with tape during the exposure. The flatness of the film was about 2 mm.

FIG. 11 a) A silicon nitride stencil mask with $0.8 \times 1.6$ $\mu m^2$ openings. FIG. 10 b) is the 50 keV He+ image of the stencil mask in a) printed in a sample of Mylar sheet stock. The Mylar $1 \times 1$ $in^2$ sheet was loosely attached to a holder with tape at the corners. The flatness of the wrinkled sample was estimated at 2 mm. The film was developed in hot KOH (40° C.). Although the energy of the helium ions was insufficient to completely penetrate the mylar film, this micrograph clearly demonstrates direct patterning of mylar with helium ions over a large depth of field.

We claim:

1. A lithographic exposure device for fabricating a microporous filter membrane, said microporous filter membrane not supported by a solid substrate, comprising:
   means for exposing a membrane substrate to a beam comprising at least one energetic particle, wherein said energetic particle has an energy level greater than about 10 keV;
   means for applying a high emissivity coating to said membrane substrate prior to exposing said membrane substrate to said beam;
   means for conveying said membrane substrate; and
   a mask positioned between said membrane substrate and at least one source of said at least one energetic particle, said beam comprising at least one particle transmitted through said mask.

2. The lithographic exposure device of claim 1, wherein said device fabricates a filter membrane comprising at least one pore.

3. The lithographic exposure device of claim 1, wherein said mask is substantially stationary.

4. The lithographic exposure device of claim 1, wherein said means for conveying said membrane substrate further comprises a clamp for securing said membrane substrate.

5. The lithographic exposure device of claim 1, wherein said means for conveying said membrane substrate advances said membrane substrate in a stepwise fashion, and wherein said membrane substrate is advanced about a length of said mask for every step.

6. The lithographic exposure device of claim 1, further comprising an etchant exposure system.

7. The lithographic exposure device of claim 1, further comprising a means for removing said high emissivity coating from said filter membrane substrate after said exposure.

8. A filter membrane produced with a device according to claim 1.

9. The lithographic exposure device of claim 1, wherein said energetic particle is selected from at least one of an ion, a photon, an electron, a neutral energetic atom and an energetic molecule.

10. The lithographic exposure device of claim 1, wherein said energetic particle comprises at least one of hydrogen or helium ions.

11. A lithographic exposure device for fabricating a microporous filter membrane, said microporous filter membrane not supported by a solid substrate, comprising:
    a radiation source directed at least partially on a membrane substrate, wherein said radiation source's emitted radiation comprises a beam of at least one energetic particle, wherein said energetic particle has an energy level greater than about 10 keV;
    a device for applying a high emissivity coating to a membrane substrate prior to exposure to said radiation source;
    a device for conveying said membrane substrate comprising at least one supply reel and at least one take-up reel; and
    a mask positioned between said membrane substrate and at least one source of said at least one energetic particle, said beam comprising at least one particle transmitted through said mask.

12. The lithographic exposure device of claim 11, wherein said mask is substantially stationary.

13. The lithographic exposure device of claim 11, wherein said device for conveying said membrane substrate further comprises a clamp for securing said membrane substrate.

14. The lithographic exposure device of claim 13, wherein said clamp is electrostatic.

15. The lithographic exposure device of claim 11, further comprising an etchant exposure system.

16. The lithographic exposure device of claim 11, further comprising a device for removing a high emissivity coating from said filter membrane substrate after said lithographic exposure.

17. A filter membrane produced with the device according to claim 11.

18. The lithographic exposure device of claim 11, wherein said energetic particle comprises helium ions.

19. The lithographic exposure device of claim 11, wherein said energetic particle comprises hydrogen ions.

20. A process for fabricating a microporous filter membrane, said microporous filter membrane not supported by a solid substrate, said process comprising the steps of:
    conveying a membrane substrate in a stepwise fashion adjacent a mask;
    applying a high emissivity coating to said membrane substrate;
    damaging said membrane substrate with at least one beam comprising at least one energetic particle emitted from at least one radiation source directed at least partially through said mask, wherein said energetic particle has an energy level greater than about 10 keV, and wherein said damaging occurs after said application of said high emissivity coating to said membrane substrate; and
    removing said damaged membrane substrate with an etchant.

21. The process of claim 20, wherein said step of conveying said membrane substrate in a stepwise fashion advances said membrane substrate about a length of said mask for every step.

22. The process of claim 20, wherein said membrane substrate is substantially stationary for at least a portion of each step.

23. A filter membrane produced according to the process of claim 20.

24. The process of claim 20, wherein said high thermal emissivity coating is applied only to one side of said membrane substrate.

25. The process of claim 20, further comprising the step of removing said high emissivity coating from said membrane substrate after said damaging.

26. The process of claim 20, wherein said energetic particle comprises at least one of hydrogen or helium ions.

27. A process for fabricating a microporous filter membrane, said process comprising the steps of:
  applying an intermediate mask layer and a resist coating to a membrane substrate;
  applying a high emissivity coating to said membrane substrate;
  conveying said membrane substrate in a stepwise fashion adjacent a mask;
  exposing said resist coating with at least one beam comprising at least one energetic particle emitted from at least one radiation source directed at least partially through said mask, wherein said energetic particle has an energy level greater than about 10 keV, and wherein said exposure occurs after said application of said high emissivity coating to said membrane substrate;
  developing said resist coating;
  etching said resist coating's pattern through said intermediate mask layer; and
  etching said intermediate mask layer's pattern into said membrane substrate.

28. The process of claim 27, wherein said high thermal emissivity coating is applied only to one side of said membrane substrate.

29. The process of claim 27, further comprising the step of removing said high emissivity coating from said membrane substrate after said exposure.

30. The process of claim 27, wherein said energetic particle comprises at least one of hydrogen or helium ions.

* * * * *